United States Patent
Meyer et al.

(10) Patent No.: US 8,306,289 B1
(45) Date of Patent: Nov. 6, 2012

(54) METHOD AND SYSTEM FOR OFF-RESONANCE CORRECTION FOR NON-CARTESIAN PARALLEL IMAGE RECONSTRUCTION

(75) Inventors: Craig H. Meyer, Charlottesville, VA (US); Weitian Chen, Union City, CA (US); Peng Hu, Quincy, MA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 1289 days.

(21) Appl. No.: 12/036,805

(22) Filed: Feb. 25, 2008

Related U.S. Application Data

(60) Provisional application No. 60/903,149, filed on Feb. 23, 2007, provisional application No. 60/998,177, filed on Oct. 9, 2007.

(51) Int. Cl.
*G06K 9/00* (2006.01)

(52) U.S. Cl. ........ 382/128; 382/129; 382/130; 382/131; 382/269; 382/255; 378/21

(58) Field of Classification Search .......... 382/128–131, 382/269, 255; 378/21
See application file for complete search history.

(56) References Cited

U.S. PATENT DOCUMENTS

| | | | | |
|---|---|---|---|---|
| 5,270,653 A * | 12/1993 | Pauly | | 324/309 |
| 5,402,067 A * | 3/1995 | Pauly et al. | | 324/307 |
| 5,483,567 A | 1/1996 | Swerdloff | | |
| 5,485,086 A | 1/1996 | Meyer et al. | | |
| 5,910,728 A | 6/1999 | Sodickson | | |
| 6,020,739 A | 2/2000 | Meyer et al. | | |
| 6,064,388 A | 5/2000 | Reyzin | | |
| 6,144,873 A * | 11/2000 | Madore et al. | | 600/410 |
| 6,178,271 B1 | 1/2001 | Maas, III | | |
| 6,215,306 B1 * | 4/2001 | Tsai et al. | | 324/309 |
| 6,326,786 B1 | 12/2001 | Pruessmann et al. | | |
| 6,486,670 B2 * | 11/2002 | Heid | | 324/307 |
| 6,841,998 B1 * | 1/2005 | Griswold | | 324/309 |
| 6,853,191 B1 | 2/2005 | Miller et al. | | |
| 6,903,551 B2 | 6/2005 | Madore | | |
| 7,064,547 B1 * | 6/2006 | King et al. | | 324/309 |
| 7,078,899 B2 * | 7/2006 | Dale et al. | | 324/314 |
| 7,132,827 B2 | 11/2006 | Griswold et al. | | |
| 7,202,663 B2 * | 4/2007 | Huang | | 324/307 |
| 7,348,776 B1 * | 3/2008 | Aksoy et al. | | 324/307 |
| 7,403,005 B2 * | 7/2008 | Katscher et al. | | 324/309 |
| 7,642,777 B1 * | 1/2010 | Meyer et al. | | 324/309 |
| 7,860,291 B2 * | 12/2010 | Hwang | | 382/131 |
| 2003/0206016 A1 * | 11/2003 | Madore | | 324/309 |
| 2005/0074152 A1 * | 4/2005 | Lewin et al. | | 382/128 |
| 2005/0189942 A1 * | 9/2005 | Tsao et al. | | 324/310 |
| 2006/0013459 A1 * | 1/2006 | Katscher et al. | | 382/131 |
| 2008/0080775 A1 * | 4/2008 | Zabih et al. | | 382/226 |
| 2008/0144900 A1 * | 6/2008 | Li et al. | | 382/130 |

OTHER PUBLICATIONS

Bosco—operations, Hu et al. PISMRM 14., 2006 p. 10.*
Griswold, Mark A., et al., " Generalized Autocalibrating Partially Parallel Acquisitions (GRAPPA)" Magnetic Resonance in Medicine 47:1202-1210 (2002).

(Continued)

*Primary Examiner* — Jayesh A Patel
(74) *Attorney, Agent, or Firm* — Blank Rome LLP

(57) ABSTRACT

In MR imaging using a multi-coil device, multifrequency interpolation is combined with a convolution such as BOSCO to achieve simultaneous parallel reconstruction and off-resonance correction. The unaliased and deblurred image is calculated for each coil, and the final image is formed from the images for all of the coils.

28 Claims, 19 Drawing Sheets

OTHER PUBLICATIONS

Pruessmann, Klaas P. et al., "Advance in Sensitivity Encoding With Arbitrary k-Space Trajectories", Magnetic Resonance in Medicine 46:638-651 (2001).

Griswold, M.A. et al., "The GRAPPA Operator" Proc. Intl. Soc. Reson. Med 11:2348 (2003).

Heberlein, K.A. et al., "Segmented Spiral Parallel Imaging Using GRAPPA" Proc. Intl. Soc. Mag. Reson. Med. 11:328 (2004).

Nayak, Krishna S. et al., "Real Time Interactive Coronary MRA", Magnetic Resonance in Medicine 46:430-435 (2001).

Yeh, Ernest N. et al., "3 Parallel Magnetic Resonance Imaging with Adaptive Radius in k-Space (PARS): Constrained Image Reconstruction using k-Space Locality in Radiofrequency Coil Encoded Data" Magnetic Resonance in Medicine 53:1383-1392 (2005).

Sodickson, Daniel K. et al., "Simultaneous Acquisition of Spatial Harmonics (SMASH): Fast Imaging with Radiofrequency Coil Arrays" Magnetic Resonance in Medicine 38:591-603 (1997).

Pruessmann, Klaas P. et al., "SENSE: Sensitivity Encoding for Fast MRI" Magnetic Resonance in Medicine 42:952-962 (1999).

Heidemann, R.M. et al., "Fast Parallel Image Reconstructions With non- Cartesian Trajectories", Proc. Intl. Soc. Mag. Reson. Med. 11:2374 (2003).

Bernstein, Matt A. et al, Handbook of MRI Pulse Sequence, Elsevier Academic Press, 204, pp. 319-323.

Speier, P. et al., "Robust Radial Imaging with Predetermined Isotropic Gradient Delay Correction," Proc. Intl. Soc. Mag. Reson. Med. 14 (2006), p. 2379.

DeZanche, N. et al., "Advances in NMR Probe Technology for Magnetic Field Monitoring," Proc. Intl. Soc. Mag. Reson. Med. 14 (2006) p. 781.

Jung, Youngkyoo, et al., Consistent Non-Cartesian Off-Axis MRI Quality: Calibrating and Removing Multiple Sources of Demodulation Phase Errors, Magnetic Resonance in Medicine 57:206-212 (2007).

Aldefeld, B. et al., "Effects of Gradient Anisotropy in MRI," Magnetic Resonance in Medicine, 39:606-614 (1998).

Davies, Nigel P., et al., "Calibration of Gradient Propagation Delays for Accurate Two-Dimensional Radiofrequency Pulses," Magnetic Resonance in Medicine 53:231-236 (2005).

Duyn, Jeff H., et al., "Simple Correction Method for K-space Trajectory Deviations in MRI," J Magn Reson 1998, 132:150-153.

Peters, Dana C., et al., "Centering the Projection Reconstruction Trajectory: Reducing Gradient Delay Errors," Magn Reson Med 2003, 50:1-6.

Zhang, Yantian, et al., "A Novel K-space Trajectory Measurement Technique," Magn Reson Med 1998, 39:999-1004.

Spielman, Daniel, et al., "Spiral Imaging on a Small-Bore System at 4.7T," Magn Reson Med 1995, 34:580-585.

Hu, P. et al, "BOSCO: Parallel Image Reconstruction Based on Successive Convolution Operations," in Proceedings of the 15th Annual Meeting of ISMRM, Seattle, 2006, p. 10.

Barmet, C. et al., "Efficient Iterative Reconstruction for MRI in Strongly Inhomogeneous B0," Proceedings of the 13th Annual Meeting of ISMRM, Miami, 2004, p. 347.

Barmet, C. et al., "Sensitivity encoding and B0 Inhomogeneiy—A simultaneous Reconstruction," proceedings of the 14th Annual Meeting of ISMRM, Seattle, 2005, p. 682.

Heberlein, K. A., et al., "Segmented Spiral Parallel Imaging Using GRAPPA, " Proc. Intl. Soc. Mag. Reson. Med 11 (2004) p. 328.

\* cited by examiner

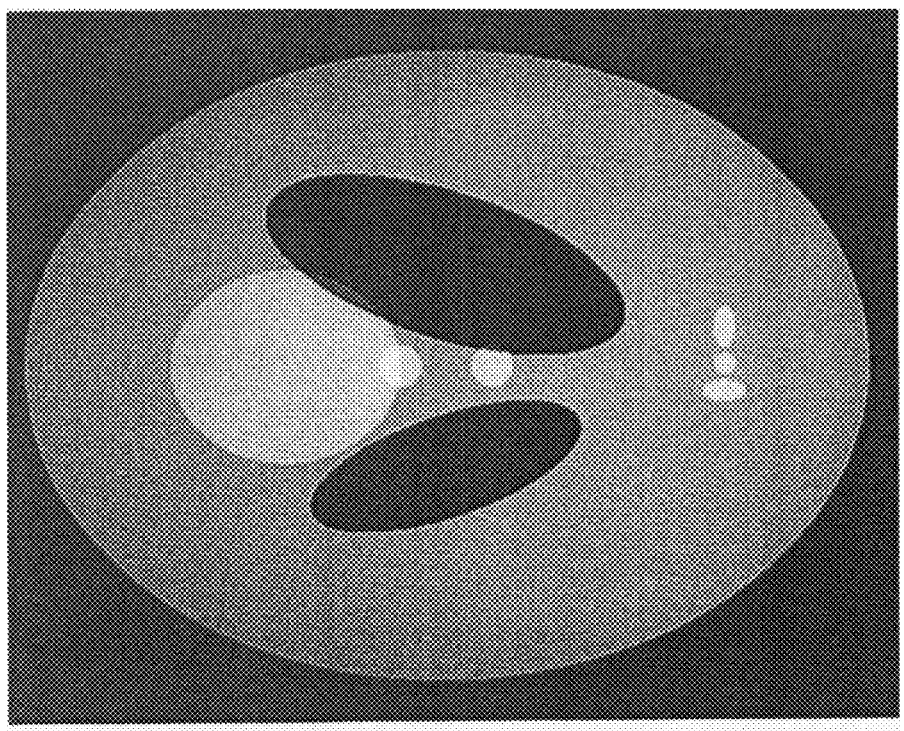
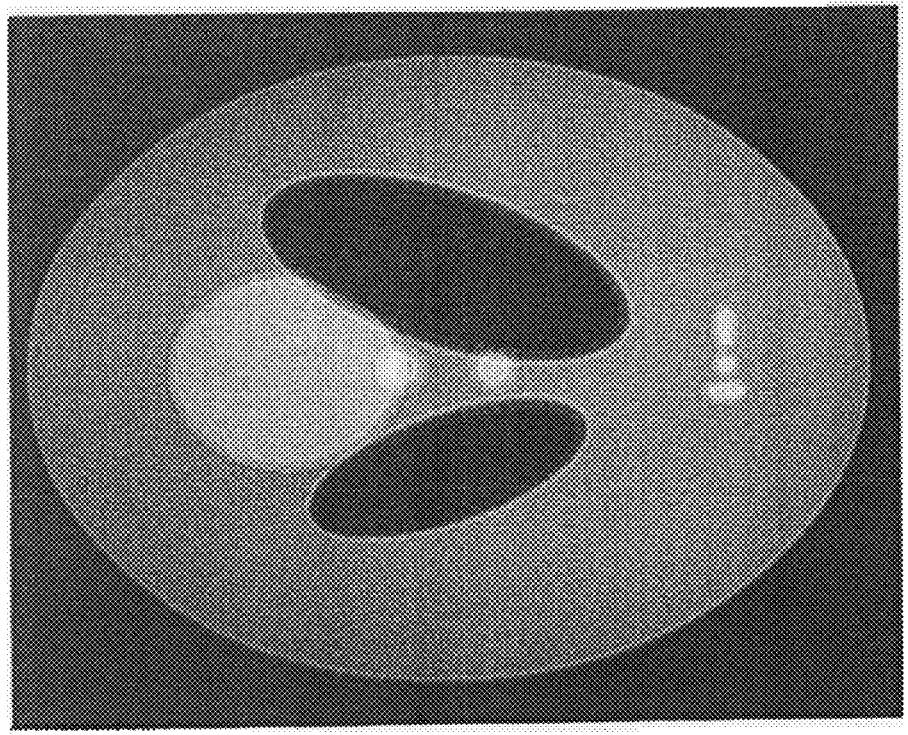
FIG. 7D
FIG. 7C

METHOD AND SYSTEM FOR OFF-RESONANCE CORRECTION FOR NON-CARTESIAN PARALLEL IMAGE RECONSTRUCTION

REFERENCE TO RELATED APPLICATIONS

The present application claims the benefit of U.S. Provisional Application No. 60/903,149, filed Feb. 23, 2007, and U.S. Provisional Application No. 60/998,177, filed Oct. 9, 2007, whose disclosures are hereby incorporated by reference in their entireties into the present disclosure.

FIELD OF THE INVENTION

The present invention is directed to non-Cartesian magnetic resonance (MR) imaging and more particularly to the correction of off-resonance effects in such imaging.

DESCRIPTION OF RELATED ART

Spiral scanning has high SNR and time-efficiency in k-space sampling. It also has good immunity to flow and motion and can achieve high temporal resolution in dynamic imaging. The main problem with spiral scanning is that off-resonance can induce image blurring. This problem has been widely discussed in non-parallel spiral acquisition, and a number of off-resonance correction methods have been proposed.

Compared to Cartesian parallel imaging, spiral parallel imaging is an inherent 2-D acceleration method and is reported to have the potential to achieve higher acceleration factors. It is also reported that spiral parallel imaging has a more uniform noise amplification across the field of view and often a smaller maximum SNR drop compared to Cartesian parallel imaging. Spiral parallel imaging has also been employed to reduce off-resonance effects by reducing the readout length without losing spatial resolution. However, the typical readout length used in spiral parallel imaging can still result in unacceptable image blurring artifacts with current scanners. In addition, off-resonance can also interfere with the unaliasing process in spiral parallel imaging, resulting in residual aliasing artifacts.

To our knowledge, no literature have comprehensively discussed the off-resonance effects in non-Cartesian parallel imaging. Barmet et al [C Barmet, J Tsao, and K P Pruessmann, "Sensitivity encoding and B0 inhomogeneity-A simultaneous reconstruction," in Proceedings of the 14th Annual Meeting of ISMRM, Seattle, 2005, p. 682; C Barmet, J Tsao, and K P Pruessmann, "Efficient iterative reconstruction for MRI in strongly inhomogeneous B0," in Proceedings of the 13th Annual Meeting of ISMRM, Miami, 2004, p. 347] has discussed the off-resonance effects in SENSE reconstruction and reported an algorithm for simultaneous off-resonance correction and unaliasing by combining multifrequency interpolation with iterative SENSE reconstruction. In their method, the off-resonance phase term is introduced into the encoding matrix and multifrequency interpolation is used to accelerate the computation. Barmet's method can handle rapid variation of field inhomogeneity, a common property shared by image reconstruction methods based on the inversion of the signal equation. A drawback of this method is its high computation and memory intensity.

A number of k-space based spiral parallel imaging methods have been proposed recently. Off-resonance induces the same image blurring with either image domain based or k-space based spiral parallel imaging methods. However, the off-resonance effect on the unaliasing process can be different between these two groups of methods.

SUMMARY OF THE INVENTION

The present invention is concerned with off-resonance effects and their correction, particularly, but not exclusively, for a k-space based spiral parallel imaging method termed BOSCO [P Hu and C H Meyer, "BOSCO: Parallel image reconstruction based on successive convolution operations," in Proceedings of the 15th Annual Meeting of ISMRM, Seattle, 2006, p. 10; see also U.S. patent application Ser. No. 11/785,734, filed Apr. 19, 2007, hereby incorporated by reference in its entirety into the present disclosure]. Some general principles discussed hereafter can also be extended to other k-space based spiral parallel imaging methods.

Off-resonance induces the same image blurring in parallel and non-parallel spiral scanning. For BOSCO reconstruction, the unaliasing process is carried out for each coil and the final image is the combination of individual unaliased coil images. We can combine conjugate phase reconstruction or its fast alternatives with BOSCO for simultaneous off-resonance correction and parallel reconstruction. Off-resonance correction can be performed on each coil data either before or after unaliasing and image reconstruction can then proceed as usual. When performing off-resonance correction before unaliasing, the demodulation is carried out along spiral interleaves. When performing off-resonance correction after unaliasing, the demodulation is carried out on Cartesian grids. A Cartesian time mask can be generated using Delaunay triangulation and then used for demodulation. The time mask only needs to be calculated once and stored for a given spiral trajectory.

Two different strategies were investigated to combine multifrequency interpolation with BOSCO to achieve simultaneous parallel reconstruction and off-resonance correction. For both strategies, we calculate the unaliased and deblurred image for each coil. The final image can then be formed by the square root of the sum of squares of the images from all coils or another method of combining unaliased images from an array of coils.

Strategy A: We perform demodulation on the raw time signal from each coil. Each demodulated data set is then convolved onto a Cartesian grid using gridding reconstruction. Among these gridded datasets, those from different coils but demodulated by the same constant frequency are used to form unaliased Cartesian k-space data by performing a BOSCO convolution. Unaliased channel images are then formed by Fourier transform. Multifrequency interpolation (3) is used to linearly combine these images to obtain a deblurred image.

Strategy B: We first perform BOSCO reconstruction to obtain unaliased k-space data on Cartesian grids. We generate a set of phase masks on the Cartesian grids using constant demodulation frequencies. The unaliased k-space data is then multiplied with these phase masks and Fourier transformed to form a set of base images. These base images are linearly combined to form a deblurred image using multifrequency interpolation. Compared to strategy A, strategy B has significant computational advantages. In the strategy A, the BOSCO kernel needs to be recalculated when the dataset is from a different demodulation frequency or the target coil is different, whereas in the strategy B, the BOSCO kernel only needs to be recalculated when the target coil is changed.

The base images can be combined in other ways, e.g., through Chebyshev approximation.

BRIEF DESCRIPTION OF THE DRAWINGS

A preferred embodiment of the invention will be set forth in detail with reference to the drawings, in which:

FIGS. 7A-7D are a simulation of 2× accelerated constant density spiral acquisition. Seven spiral interleaves were used to simulate an imaging data set;

DETAILED DESCRIPTION OF THE PREFERRED EMBODIMENT

A preferred embodiment of the invention will now be set forth in detail with reference to the drawings.

Conjugate phase reconstruction can be expressed as:

$$\tilde{m}(r) = \int m(r') \Psi(r; r') dr'$$

where m(r) and $\tilde{m}(r)$ are the true image and reconstructed image, respectively. $\Psi(r; r')$ is a kernel that is usually sparse and close to an identity matrix if off-resonance correction is included.

To demonstrate conjugate phase reconstruction of an under-sampled data set, we calculate the kernel $\Psi(r; r')$ for a 2× under-sampled spiral acquisition. A smooth field map is used to simulate the off-resonance effect. Without losing generality, we calculate the kernel at a single point within the field of view.

Figure 1A:
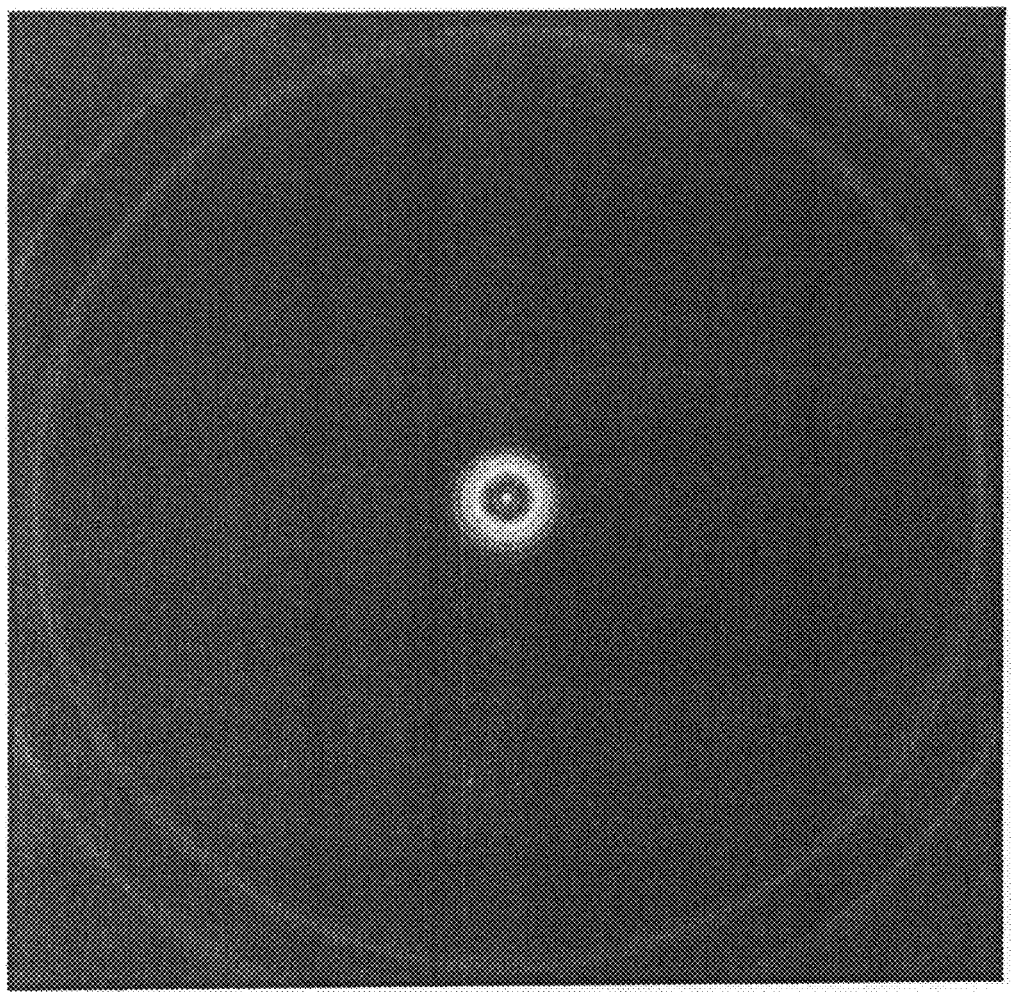
FIGS. 1A-1D show a conjugate phase reconstruction kernel.
Figure 1B:
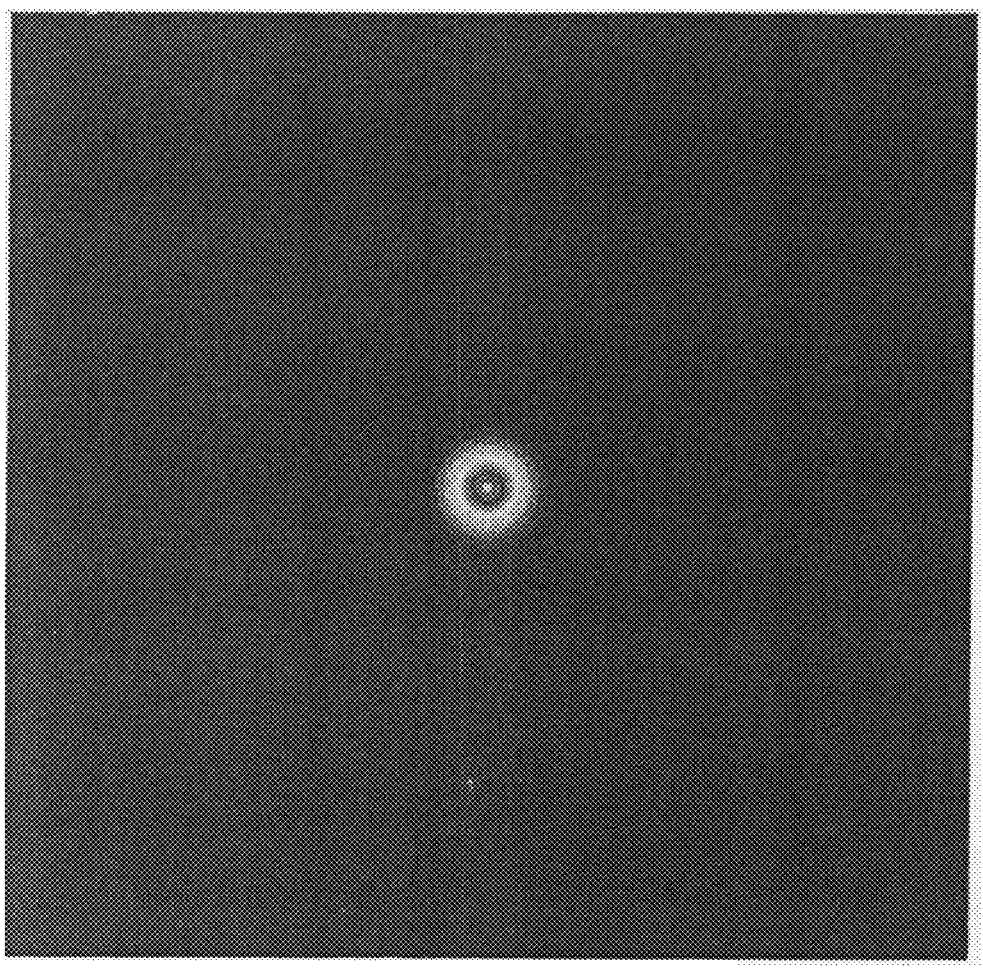
Figure 1C:
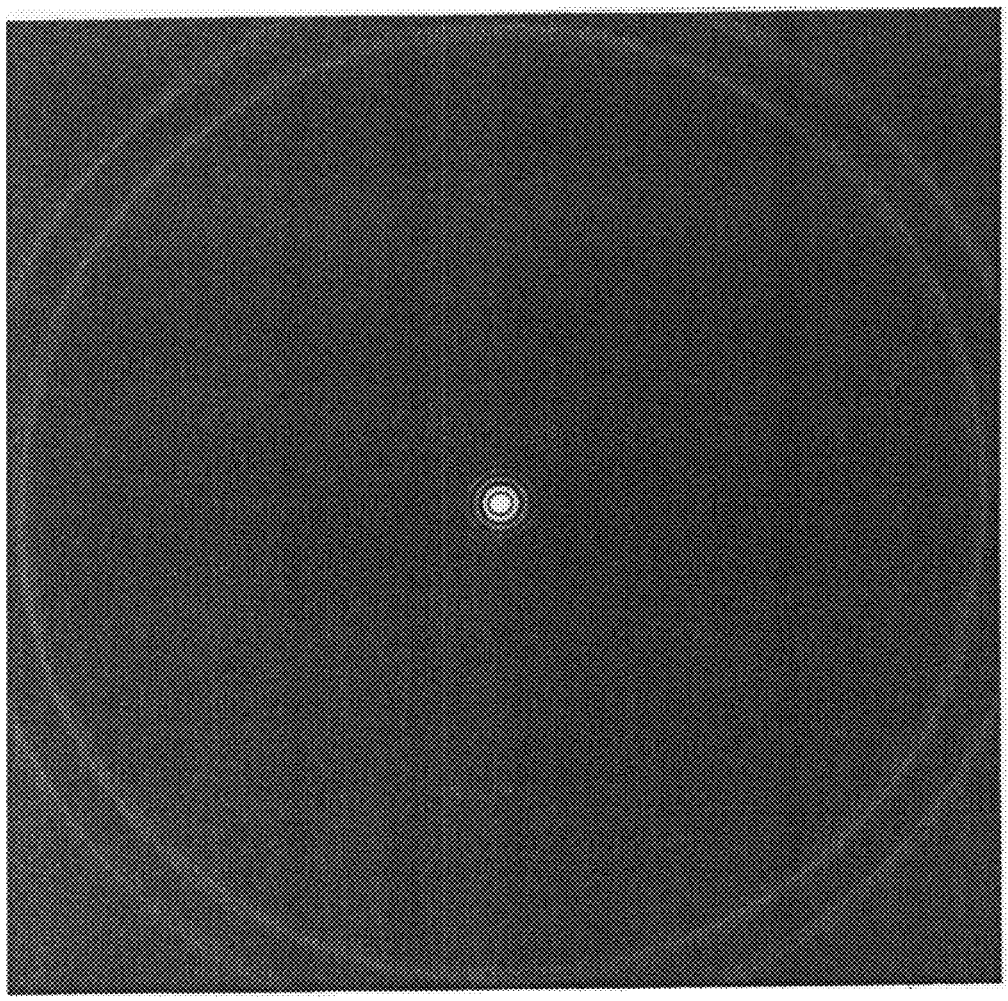
Figure 1D:
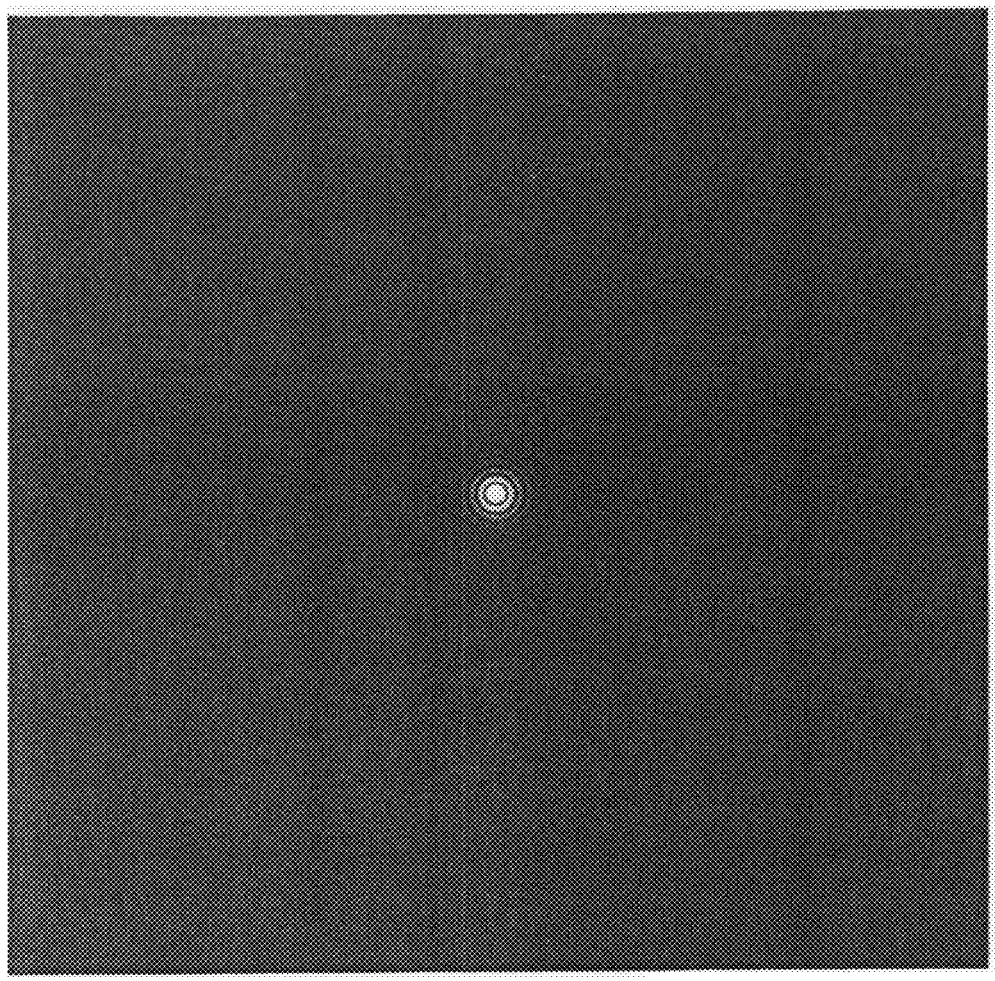

FIGS. 1A-1B and 1C-1D show the results without and with off-resonance correction included in the kernel calculation, respectively. FIG. 1A shows magnitude of the kernel without off-resonance correction using half of the spiral interleaves. The kernel calculated using the other half of the spiral interleaves has the same magnitude pattern. FIG. 1B shows the magnitude of the complex sum of two kernels without off-resonance correction. FIG. 1C shows the magnitude of the kernel with off-resonance correction using half of the spiral interleaves. The kernel calculated using the other half of the spiral interleaves has same magnitude pattern. FIG. 1D shows the magnitude of complex sum of two kernels with off-resonance correction. Note that the aliasing energy cancels out in both cases Note that conjugate phase reconstruction with off-resonance correction focuses the central lobe and also deblurs the side lobes. FIG. 1C shows the kernel with off-resonance correction calculated using half of spiral interleaves. The kernel of the other half of the spiral interleaves has the same magnitude pattern. FIG. 1D shows the magnitude of the complex sum of these two kernels. Note the aliased energy from each kernel is canceled out after summation, which is same as the case when no off-resonance correction is included in the kernel calculation, as shown in FIG. 1B. This indicates that conjugate phase reconstruction handle the central lobe and the side lobes independently during off-resonance correction process. This property is necessary if we want to apply off-resonance correction directly on aliased data sets. Other off-resonance correction methods, such as SPHERE, are not applicable for off-resonance correction on aliased data sets since the aliased energy can mix with central lobe during the reconstruction process.

Figure 2A:
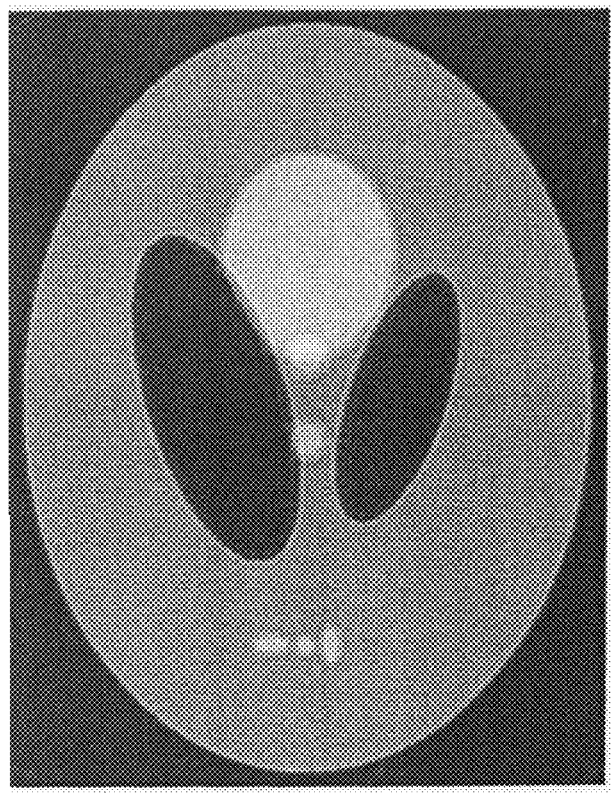
FIGS. 2A-2E show an example of off-resonance correction on aliased data sets using conjugate phase reconstruction.
Figure 2B:
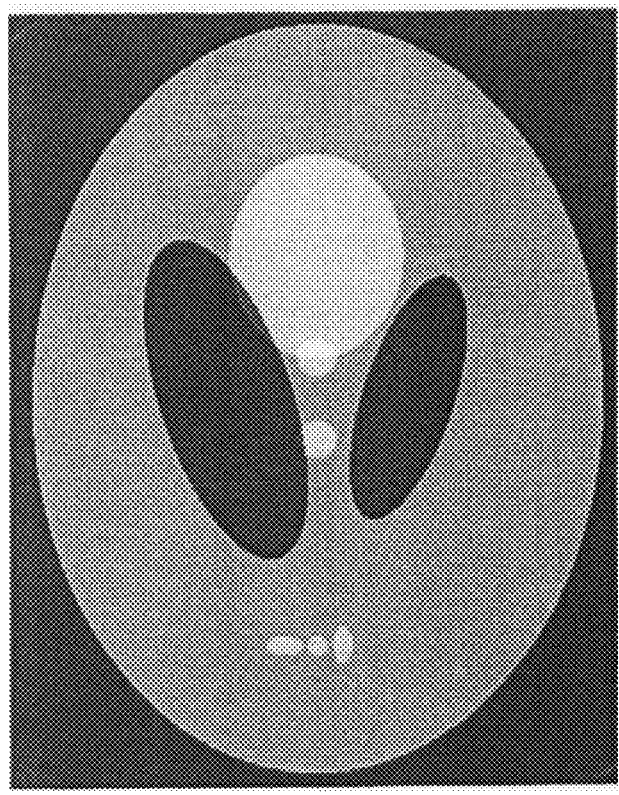
Figure 2C:
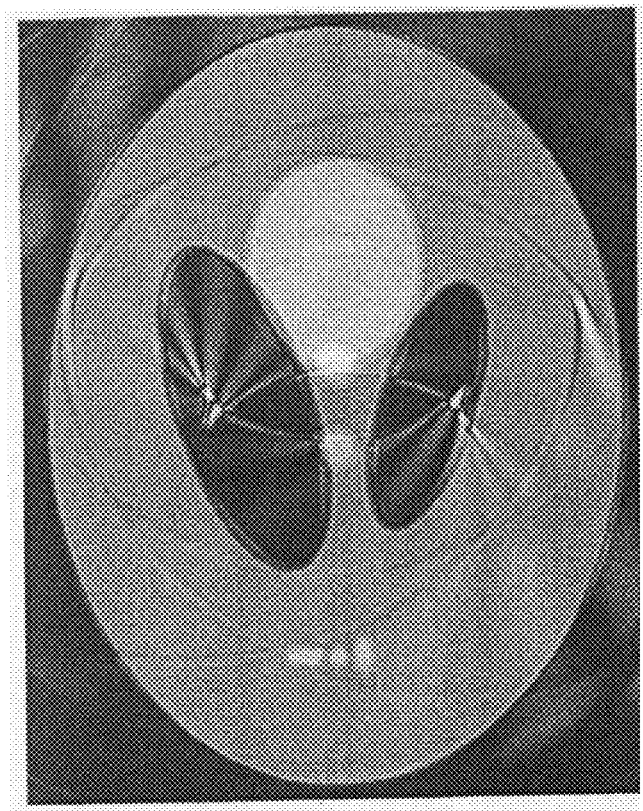
Figure 2D:
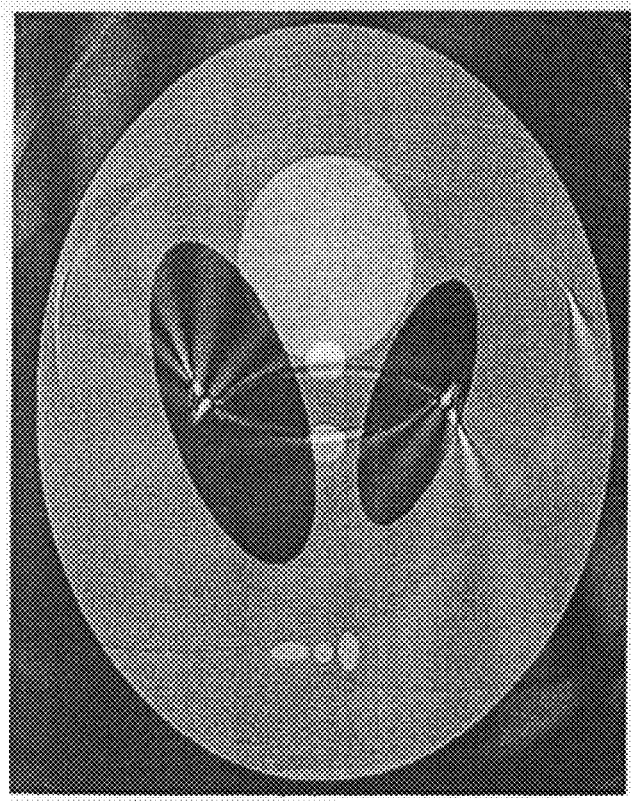
Figure 2E:
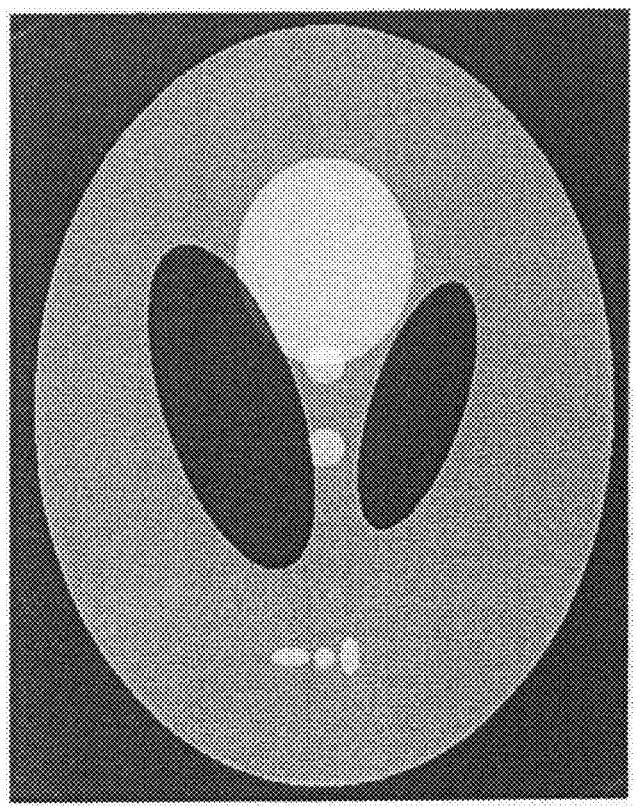

An example of off-resonance correction on aliased data sets using conjugate phase reconstruction is shown in FIGS. 2A-2E. FIG. 2A shows an image without off-resonance correction; FIG. 2B, the image after off-resonance correction on a fully-sampled spiral acquisition; FIG. 2C, the image using half of the spiral interleaves, no off-resonance correction applied; FIG. 2D, the image using half of the spiral interleaves with off-resonance correction directly applied on under-sampled data set; and FIG. 2E, the image which is the sum of the image of FIG. 2D and the image with off-resonance correction applied on the other half of the spiral interleaves. Note that performing off-resonance correction on a fully-sampled spiral acquisition achieves the same result as performing it on two under-sampled data sets and then summing them up.

If the field map is not accurate, performing conjugate phase reconstruction before unaliasing may cause inadequate cancellation of aliasing artifacts during the followed unaliasing process. Therefore, it is recommended to perform image deblurring after unaliasing when using conjugate phase reconstruction for off-resonance correction. In this case, the errors from field map only result in residual blurring.

Semi-automatic off-resonance correction can also be combined with BOSCO for image deblurring in spiral parallel imaging. A low resolution field map is acquired using two single shot spirals. After BOSCO reconstruction, we perform the second stage off-resonance correction on each coil with a frequency constraint from the acquired low resolution field map. When performing the second stage off-resonance correction, the demodulation process should be carried out on Cartesian grids after BOSCO convolution. The final image can be formed by square root of sum of square of individual coil images. Similar to non-parallel spiral imaging, semi-automatic off-resonance correction has reduced sensitivity to the errors of the acquired low resolution field map compared to conjugate phase reconstruction.

Barmet et al (cited above) showed that strong field inhomogeneity can induce residual aliasing artifacts in SENSE reconstruction, with Cartesian or non-Cartesian acquisition. They address this problem by iteratively solving the signal equation with an off-resonance phase term incorporated. This algorithm does not assume field inhomogeneity varies slowly in space and can achieve deblurring and unaliasing simultaneously.

Off-resonance can result in different effects on the unaliasing process in BOSCO reconstruction. In BOSCO, the unaliasing is achieved by convolving the under-sampled k-space data with small BOSCO kernels. The BOSCO kernels are estimated from fully sampled low-frequency k-space data, by a so-called training process. A basic assumption of BOSCO is that the same BOSCO kernels can be used for unaliasing of both high frequency and low frequency k-space data.

When using a dual-density spiral acquisition for parallel imaging, we can fully sample the center of k-space and undersample the outer region of k-space. To perform training, we decimate the center of k-space to simulate the under-sampling rate of data acquisition and use it as the training source. The fully sampled center of k-space data set is used as the training target. In this case, the training source and the training target have consistent off-resonance PSFs. We term this type of training as consistent training. For constant density spirals, the training target can be acquired by an additional fully-sampled single shot spiral and the training source is the beginning portion of the spiral interleaves acquired for imaging. For this type of data acquisition, the training target and the training source have inconsistent off-resonance PSFs and we term such training process as inconsistent training. For parallel imaging based on a constant density spiral, an alternative way of acquiring training data is to fully sample the low frequency region of the same k-space where imaging data is acquired and use it as the training target. However, this acquisition strategy is generally less efficient in scan speed compared to that of the single shot spiral acquisition.

For BOSCO reconstruction based on consistent training, off-resonance does not have significant impact on the unaliasing process and usually only results in image blurring under normal conditions. The explanation for this is that the BOSCO kernels used for unaliasing are derived by optimized fitting to a blurred but full FOV data set. This is in contrast to SENSE reconstruction, where image blurring and aliasing are usually concurrent when there is strong off-resonance.

For BOSCO reconstruction based on inconsistent training, off-resonance can have a significant impact on unaliasing process. Off-resonance results in different PSFs of the training source and the training target, which can cause errors in the estimated BOSCO kernels. Consequently, direct BOSCO reconstruction can result in residual aliasing as well as image blurring artifacts. To address this problem, we can perform off-resonance correction for both the training source and the training target to unwind the off-resonance phase accrual before the training. An important factor here is that the off-resonance correction method should be effective in off-resonance correction of under-sampled data since the training source is aliased. As we state in the previous subsection, conjugate phase reconstruction and its fast alternatives can be used here for this purpose. After obtaining the BOSCO convolution kernels, we can perform regular BOSCO reconstruction to obtain an unaliased image.

Figure 3:
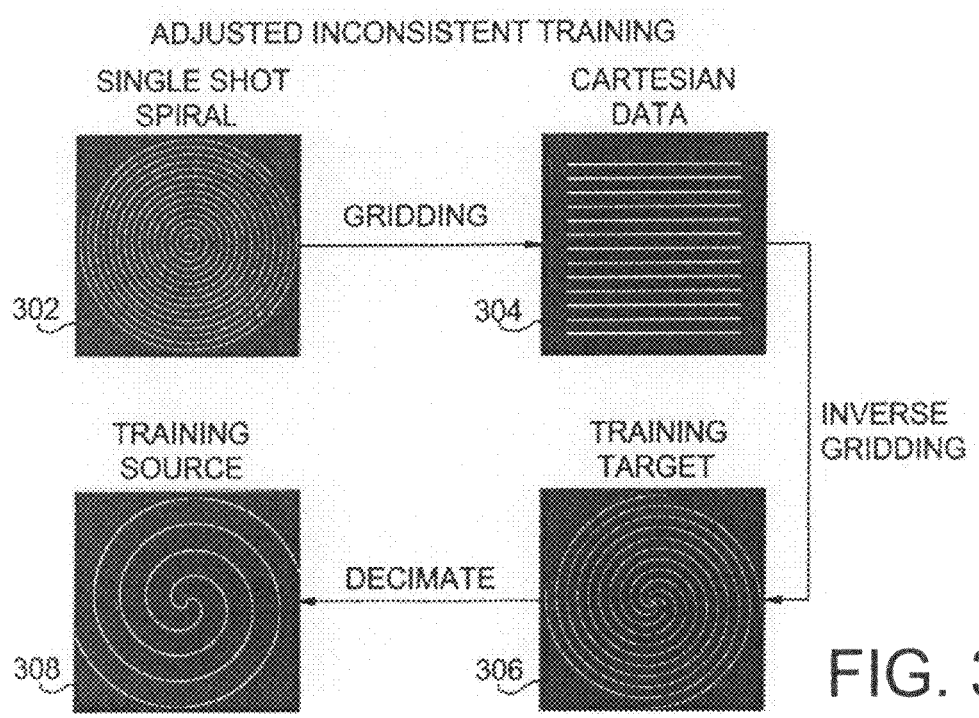
FIG. 3 shows adjusted inconsistent training.

Off-resonance correction on the training source and the training target is effective to reduce residual aliasing artifacts as long as we have knowledge of field maps. However, an accurate field map is difficult to obtain in many applications. To address this problem, we developed a training method termed adjusted inconsistent training, which will be explained with reference to FIG. 3. We first perform gridding on the training target (single shot spiral 302) to obtain Cartesian k-space data 304, and then perform inverse gridding on Cartesian data to form a training target 306 with trajectory consistent to the trajectory when the imaging data is fully sampled. The training target created by inverse gridding is decimated to form the under-sampled training source 308 with the designed acceleration factor. The newly created training source 308 and training target 302 now have comparable off-resonance phase accrual which can be canceled out during training process, resulting in BOSCO kernels with improved accuracy.

Figure 4A:
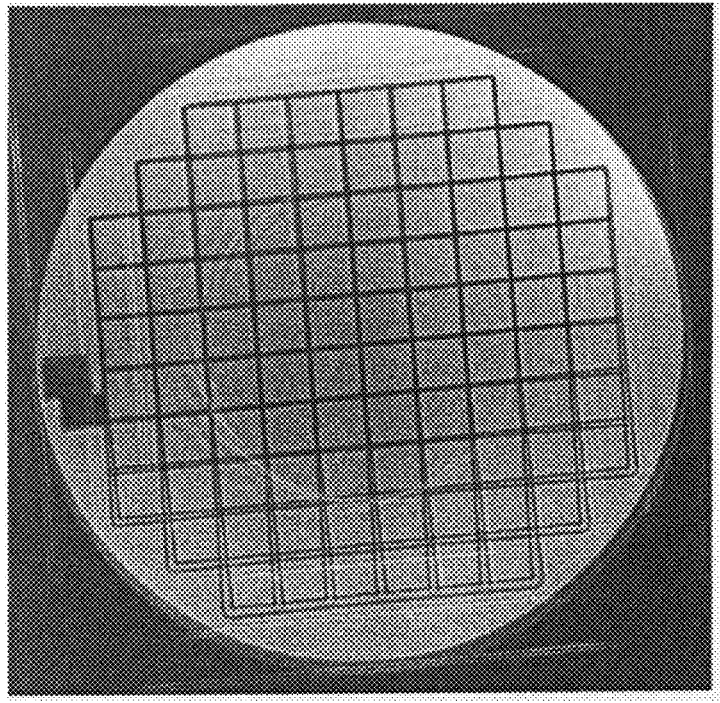
FIGS. 4A-4D show a phantom example acquired by dual density spiral scanning with 2× acceleration.
Figure 4B:
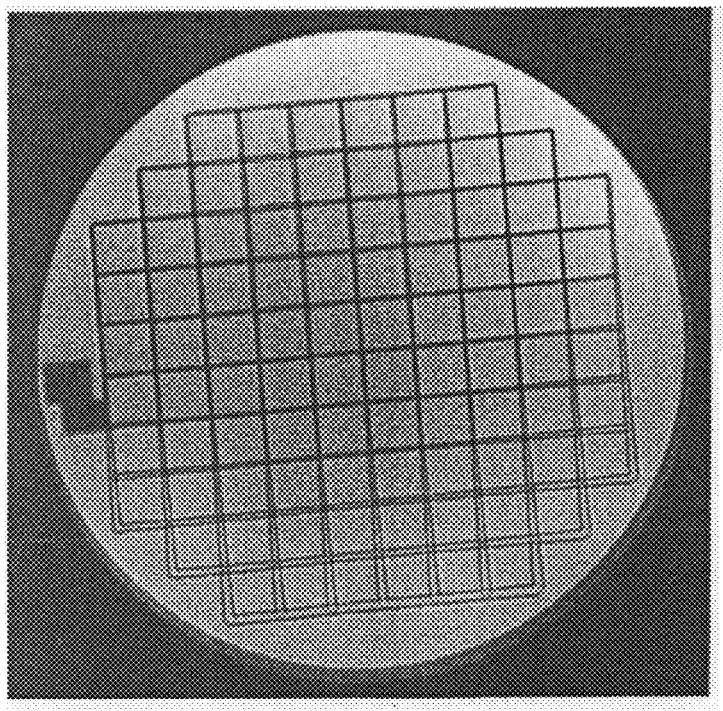
Figure 4C:
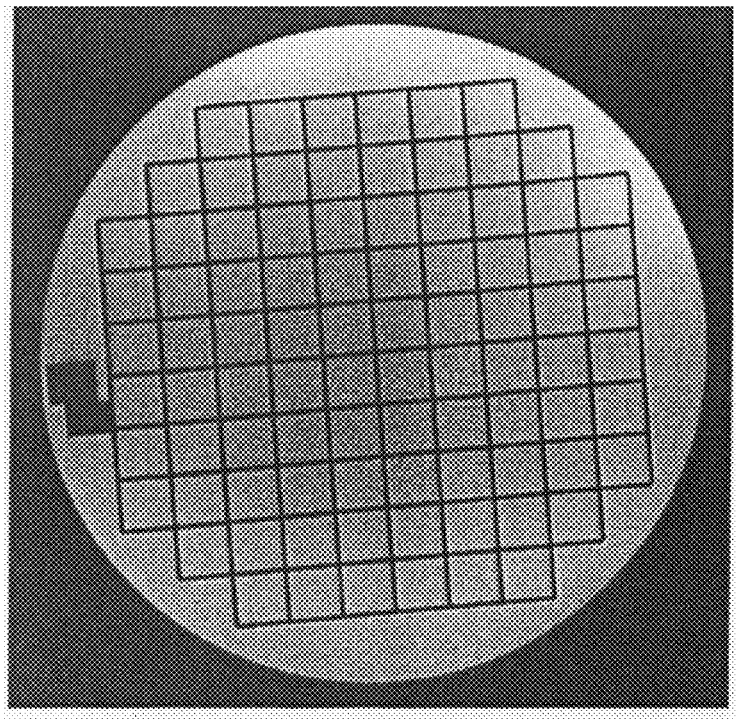
Figure 4D:
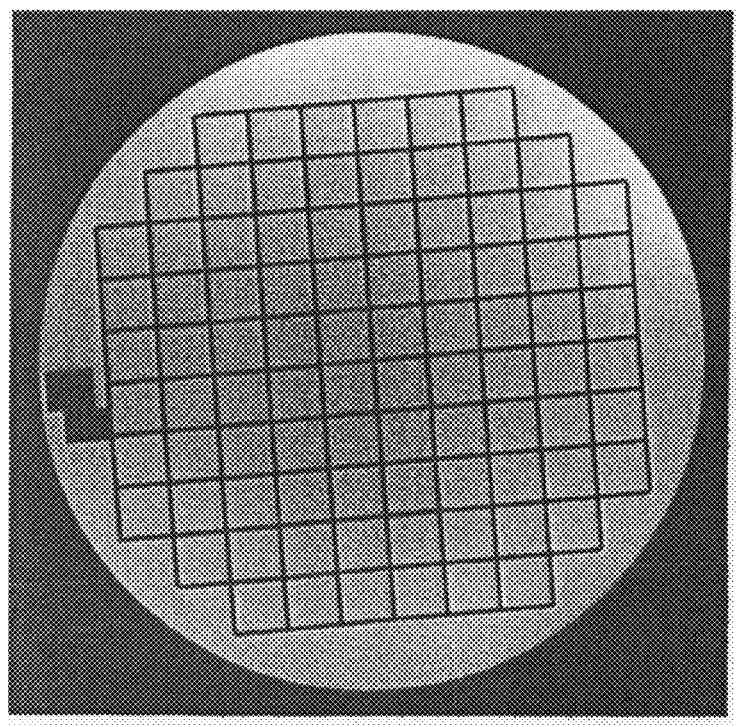

The data sets were acquired from a Siemens 1.5T Avanto scanner. FIGS. 4A-4D show a phantom example acquired by dual density spiral scanning with 2× acceleration. FIG. 4A shows an image after gridding reconstruction. FIG. 4B shows the image after BOSCO reconstruction. FIG. 4C shows the combined multifrequency interpolation reconstruction and BOSCO reconstruction. FIG. 4D shows the combined semi-automatic off-resonance correction and BOSCO reconstruction.

A low resolution field map was acquired using two single shot spirals. Sixteen spiral interleaves were used for imaging data acquisition. The readout length was 16.38 ms for both map and imaging data. FIG. 4B is the image after BOSCO reconstruction. The aliasing artifacts are removed, but the blurring artifacts are obvious at the bottom of the phantom. FIG. 4C is the image after deblurring using multifrequency interpolation reconstruction based on the acquired low resolution field map. Off-resonance correction was performed after the unaliasing process. FIG. 4D is the image after deblurring using semi-automatic off-resonance correction. The two image deblurring methods achieve similar results for this example.

Figure 5B:
FIGS. 5A-5D are an in-vivo coronary imaging example acquired by constant density spiral scanning.
Figure 5D:
Figure 5A:
Figure 5C:

FIGS. 5A-5D are an in-vivo coronary imaging example acquired by constant density spiral scanning. FIG. 5A shows an image after gridding reconstruction. FIG. 5B shows the mage after BOSCO reconstruction. FIG. 5C shows the combined multifrequency interpolation reconstruction and BOSCO reconstruction. FIG. 5D shows the combined semi-automatic off resonance correction and BOSCO reconstruction. Note semi-automatic correction achieves better deblurring than multifrequency interpolation reconstruction at the regions of coronary vein and LAD, indicating its better immunity to the errors of the acquired low resolution field map.

Only a section of image is shown for better illustration of image deblurring. A low resolution map is acquired using two single shot spirals. k-space is fully sampled using 16 spiral interleaves for imaging data acquisition and then decimated to 2× acceleration. The readout length is 16.38 ms for both map and imaging data. FIGS. 5C and 5D are images deblurred using multifrequency interpolation and semi-automatic off-resonance correction, respectively. Both methods show improved definition of the left circumflex coronary artery compared to the original image. However, the cardiac vein and LAD become more blurry after deblurring using multifrequency interpolation reconstruction, indicating the errors of the low resolution field map at these regions. This problem does not occur after semi-automatic off-resonance correction, indicating its better immunity to the errors in the acquired field map.

We use simulation and phantom data sets to illustrate the off-resonance effects on unaliasing process in BOSCO reconstruction. The unaliasing process in BOSCO is insensitive to off-resonance as long as the training target and the training source have consistent off-resonance PSFs, such as dual-density spiral acquisitions. Therefore, for dual-density spiral sampling, off-resonance correction can be applied after unaliasing to remove blurring artifacts.

Figure 6A:
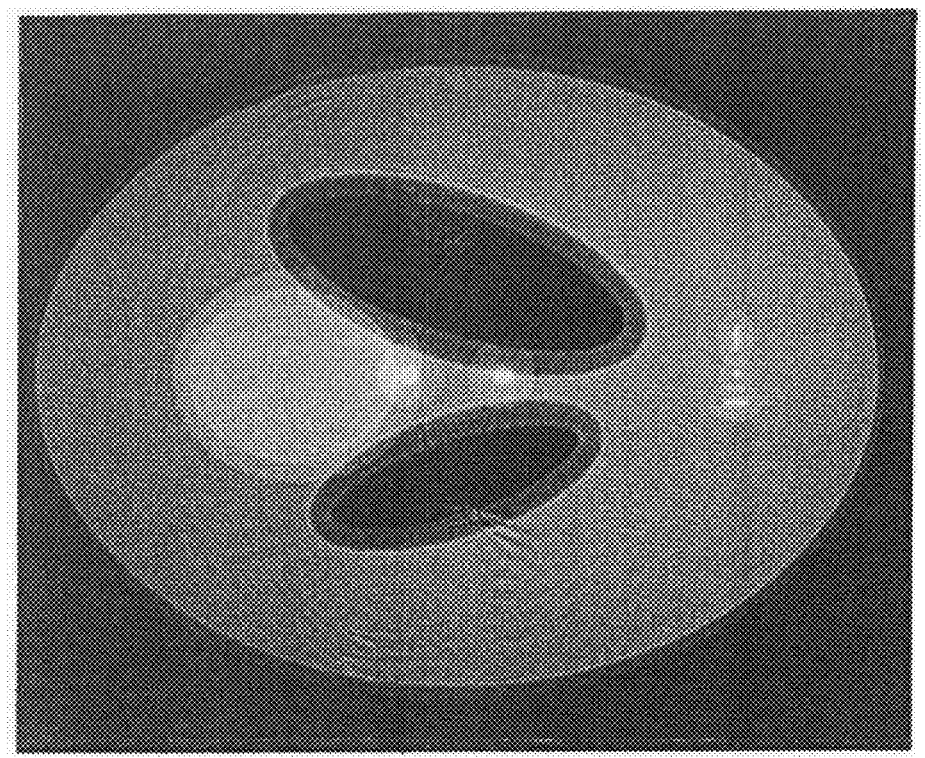
FIGS. 6A-6C are a simulation of dual density spiral acquisition using 14 interleaves.
Figure 6C:
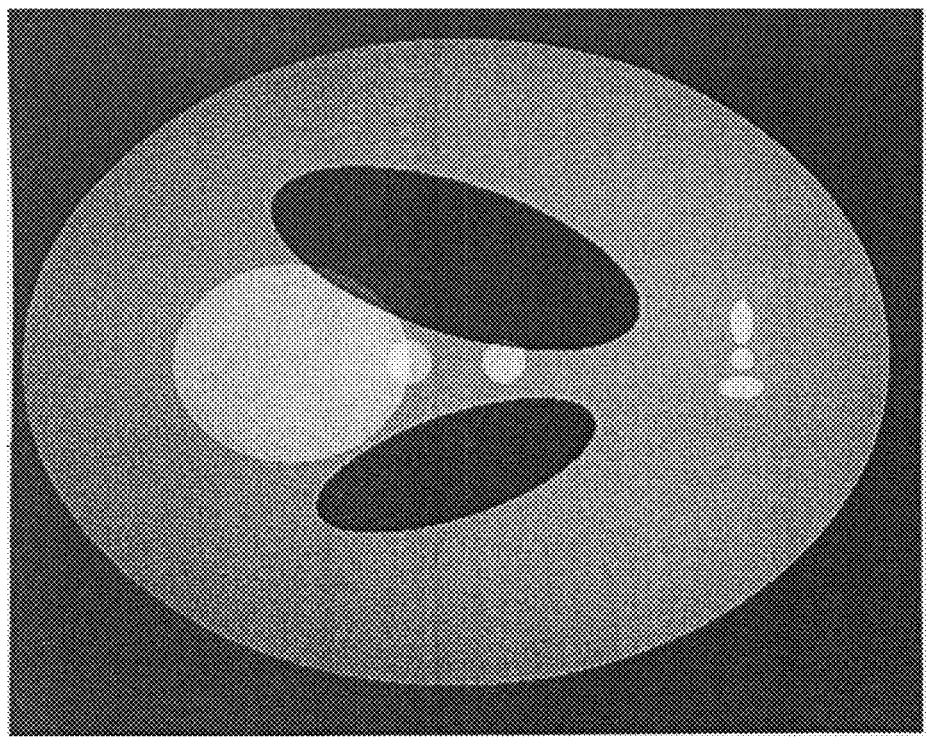
Figure 6B:
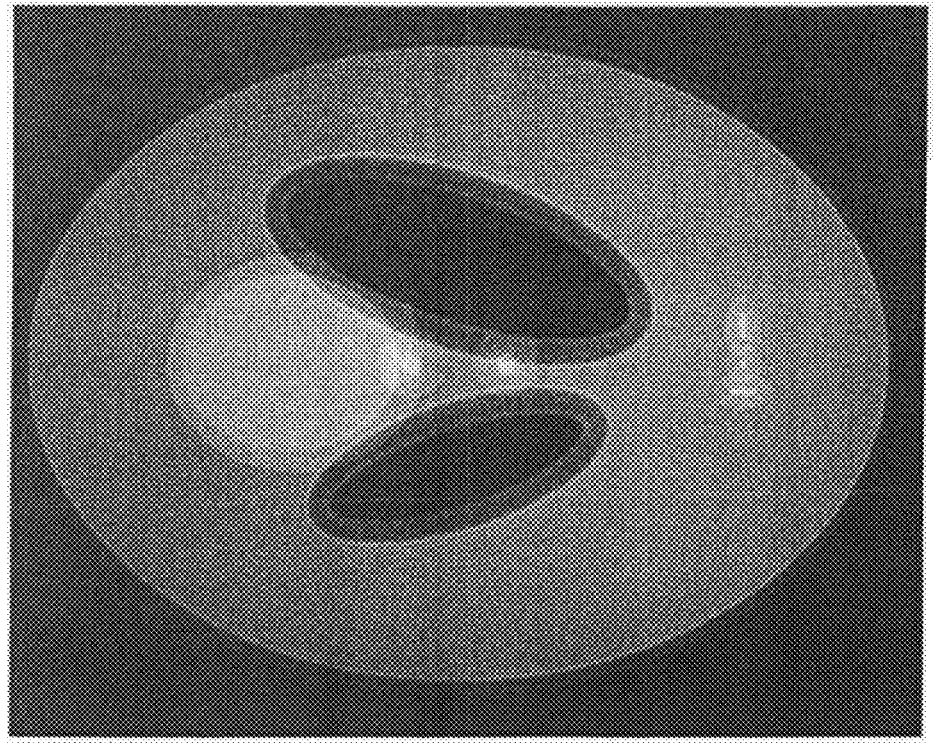

FIGS. 6A-6C are a simulation of dual density spiral acquisition using 14 interleaves. The readout length was 16.38 ms. Strong field inhomogeneity ranging from 40 to 290 Hz was generated during simulation. FIG. 6A is the result after gridding. FIG. 6B is the result after BOSCO reconstruction. Note that aliasing is removed despite the presence of strong field inhomogeneity. The image blurring is obvious in FIG. 6B. FIG. 6C is the result after image deblurring after BOSCO reconstruction. Note both blurring and aliasing artifacts are removed.

Figure 7B:
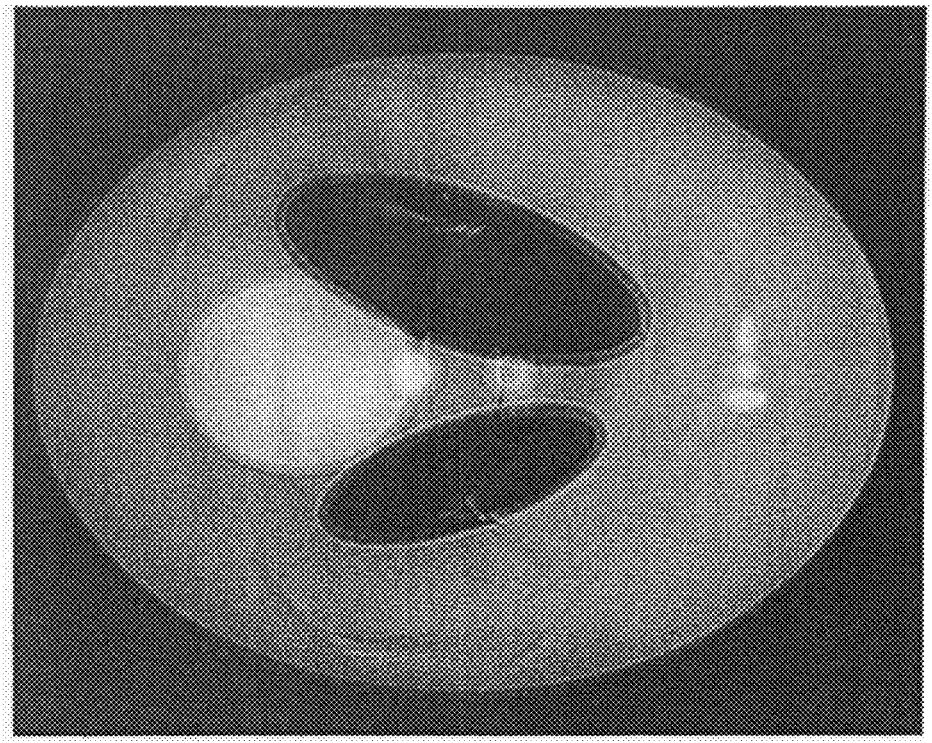
Figure 7A:
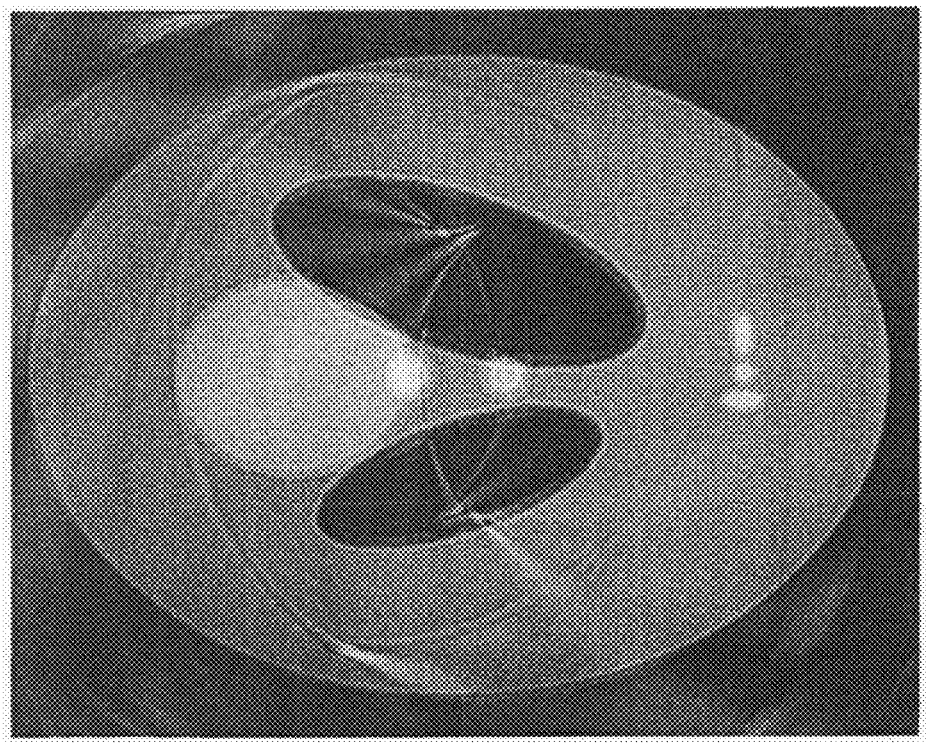

FIGS. 7A-7D are a simulation of 2× accelerated constant density spiral acquisition. Seven spiral interleaves were used to simulate an imaging data set. A single shot full FOV spiral is simulated and used as the training target. The readout length of the spiral interleaves was 16.38 ms for both single shot and multi-shot spirals. A moderate field inhomogeneity, ranging from 10 to 70 Hz, was used to simulate off-resonance effects. FIG. 7A is the result after gridding. FIG. 7B is the result after BOSCO reconstruction. Note in addition to blurring, now there are significant residual blurring artifacts after BOSCO reconstruction, supporting the theory we presented previously. To correct these off-resonance effects, we apply off-resonance correction on both the single shot spiral and the under-sampled multi-shot spiral before the training process, and then followed with BOSCO reconstruction. The result is shown in FIG. 7C. Note the aliasing artifacts are significantly reduced. In FIG. 7D, in addition to apply off-resonance correction for the training process, we applied image deblurring on under-sampled high resolution imaging data set to remove the blurring artifacts.

Figure 8A:
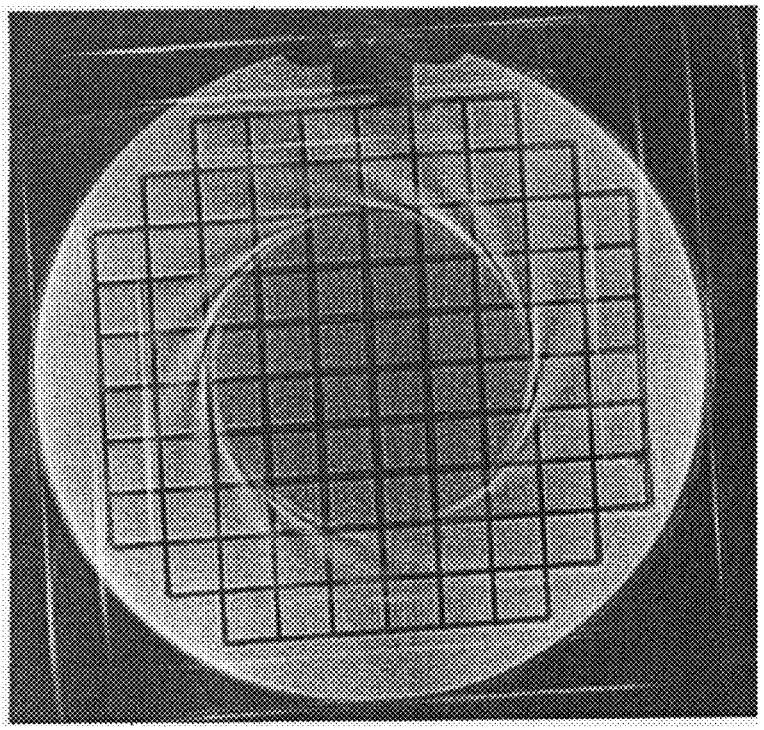
FIGS. 8A-8D are a phantom example acquired from a Siemens 1.5T Avanto scanner.
Figure 8B:
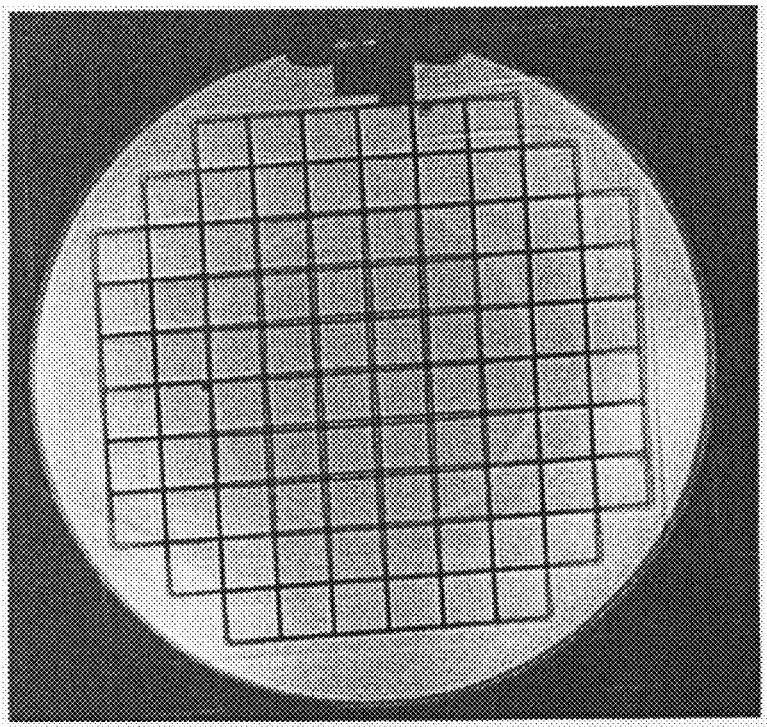
Figure 8C:
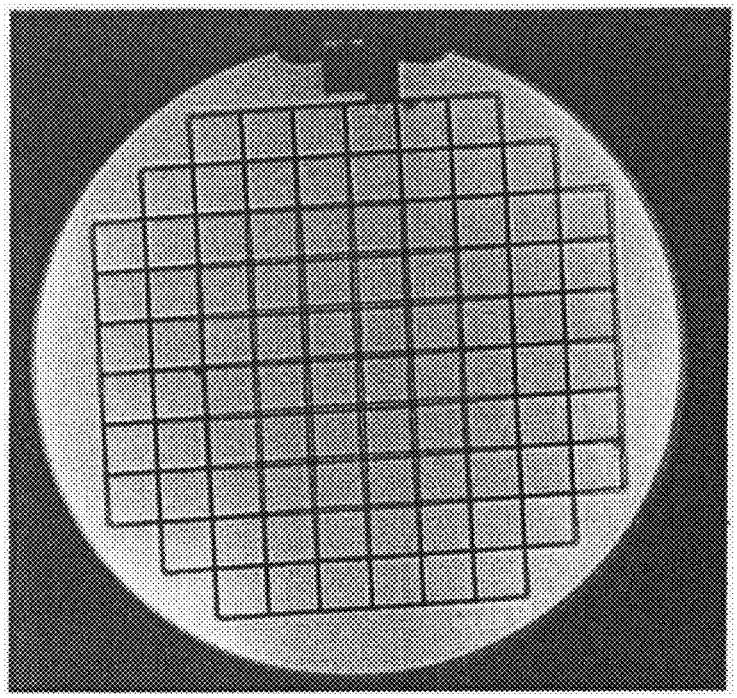
Figure 8D:
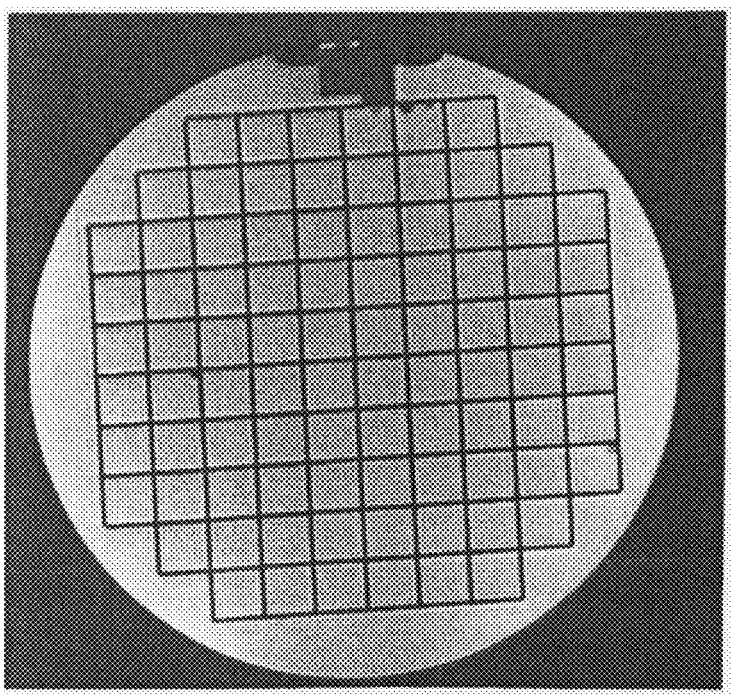

FIGS. 8A-8D are a phantom example acquired from a Siemens 1.5T Avanto scanner. The k-space is fully sampled using 14 spiral interleaves and then decimated to 2× acceleration. A low resolution field map is acquired using 2 single shot spirals to support off-resonance correction. One of the single shot spirals is used for the training process. The value of the acquired off-resonance map ranges from −30 Hz to 50 Hz. FIG. 8A is the result after gridding reconstruction. FIG. 8B is the result after BOSCO reconstruction. Note the obvious residual aliasing artifacts even under this relatively small field inhomogeneity. FIG. 8C is the result after incorporating off-resonance correction into the training process. Note that the residual aliasing artifacts are significantly reduced. FIG. 8D is after incorporating off-resonance correction into both the training and the reconstruction process. Both blurring and residual aliasing artifacts are reduced.

Figure 9A:
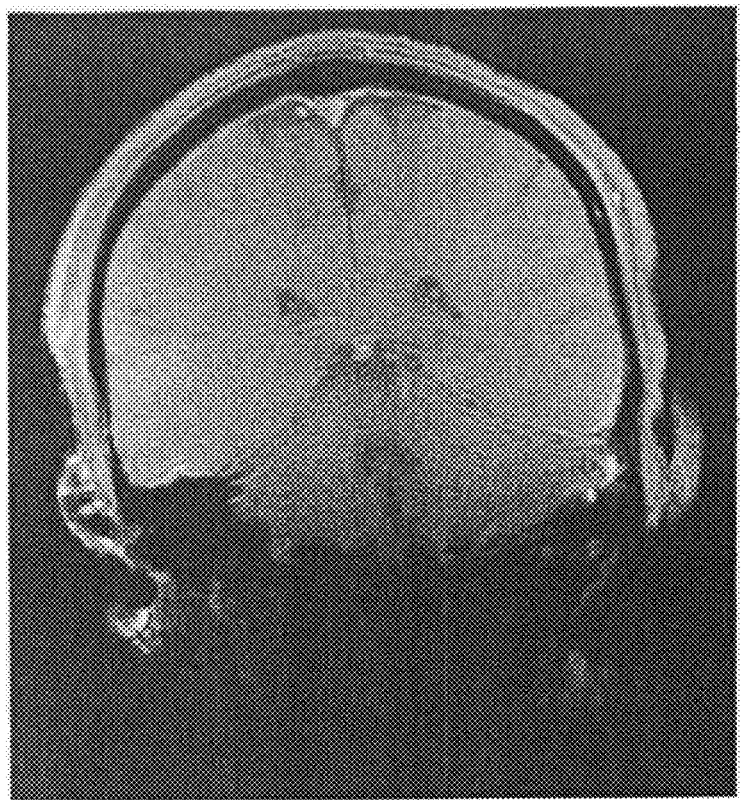
FIGS. 9A-9F are an in vivo head scan of a normal volunteer acquired from a Siemens 1.5T Avanto scanner using constant density spiral scanning.
Figure 9B:
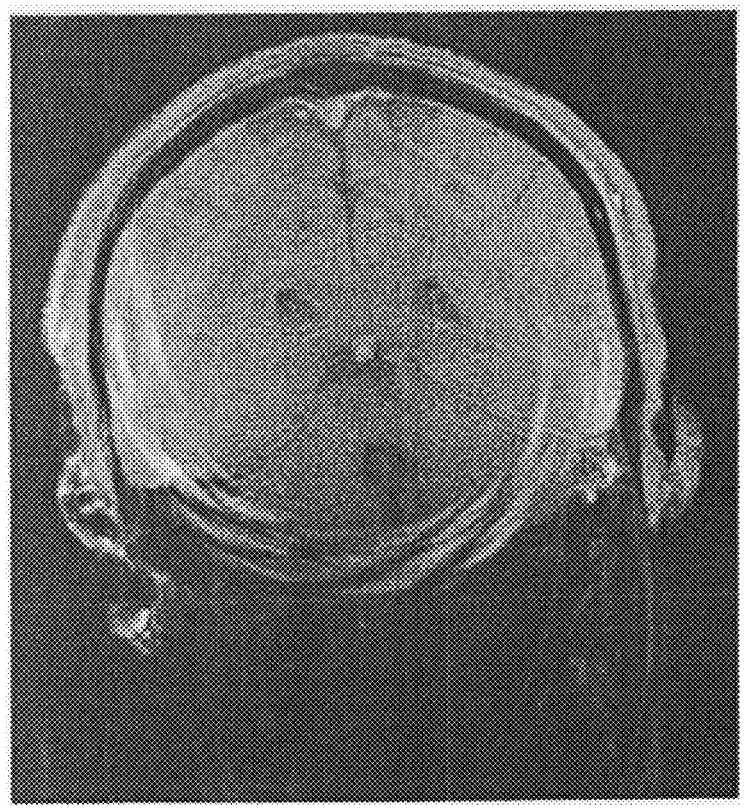
Figure 9C:
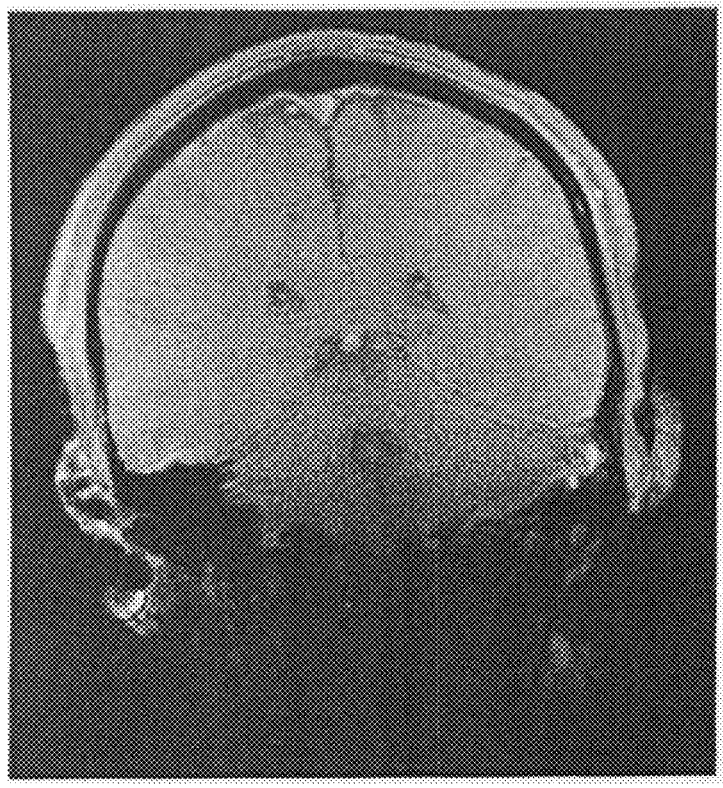
Figure 9D:
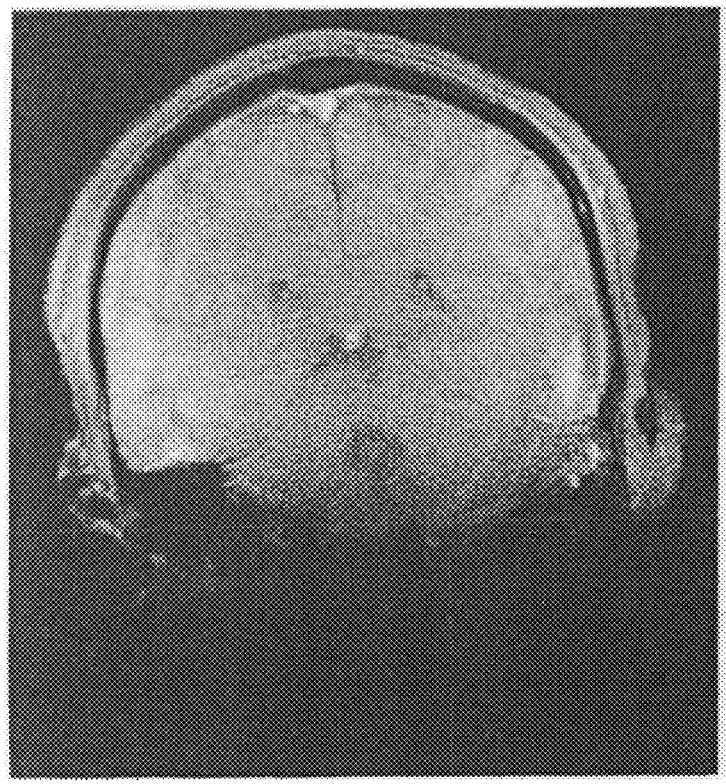
Figure 9E:
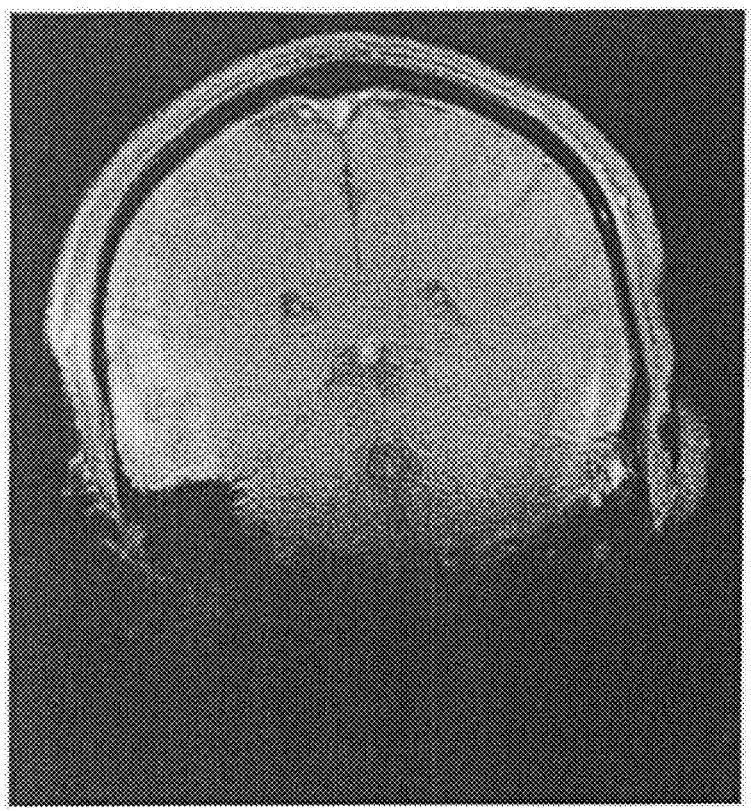
Figure 9F:
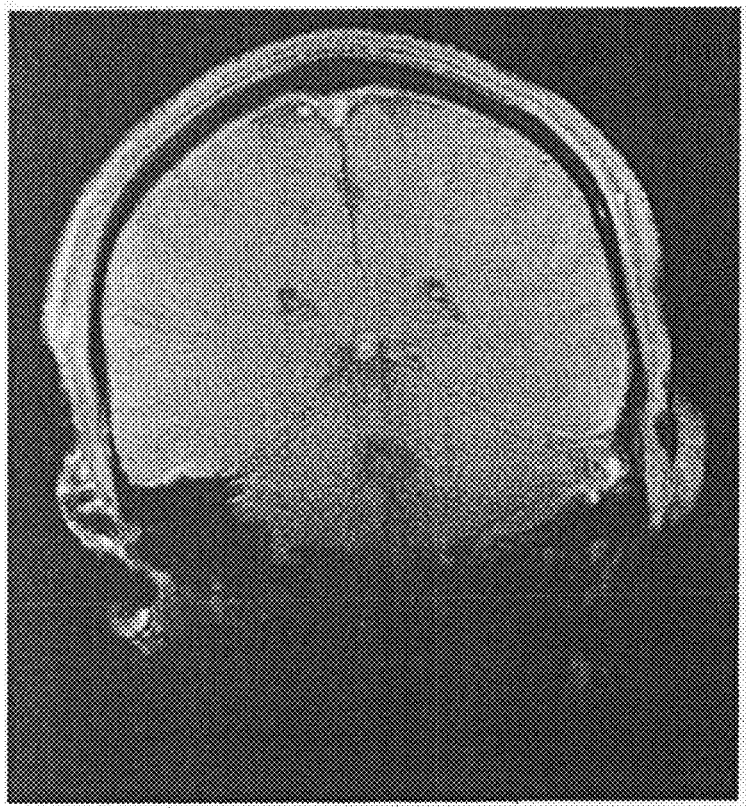

FIGS. 9A-9F are an in vivo head scan of a normal volunteer acquired from a Siemens 1.5T Avanto scanner using constant density spiral scanning. No shimming was applied when acquiring this data set. Twelve receiver channels were used for data acquisition. The k-space was fully sampled using 14 spiral interleaves with 16.4 ms readouts. A low resolution field map was acquired using two single shot spirals with the same readout length. FIG. 9A shows an image of the fully sampled data set after gridding reconstruction. Note the obvious blurring artifacts in the image. We then decimated the spiral interleaves to 2× acceleration. FIG. 9B shows the image of the 2× under-sampled data set after gridding reconstruction. FIG. 9C shows the image after BOSCO reconstruction of the 2× under-sampled data set based on consistent training. The 1.3 ms starting portion of 14 spiral interleaves acquired for imaging is used as the training target for this reconstruction. Note aliasing artifacts are successfully removed after BOSCO reconstruction based on consistent training. FIG. 9D shows the image after BOSCO reconstruction of the 2× under-sampled data set based on inconsistent training. One of the additional acquired single shot spirals is used as the training target. Note that residual aliasing artifacts are obvious. FIG. 9E is the image after applying off-resonance correction on the training target (single shot spiral) and the training source before performing inconsistent training using the acquired low resolution field map. Note the aliasing artifacts are reduced, but still obvious. The image quality is also decreased at certain region after correction, indicating the errors of the acquired field map. FIG. 9F is the image using the adjusted inconsistent training method. Note the image quality is improved compared to that of FIG. 9E.

As noted above, the images can be combined through Chebyshev approximation. The presence of B0 field inhomogeneity and concomitant gradients results in an off-resonance phase term $\phi(r,t)$ that varies in both space and time. Chebyshev approximation can be used to approximate an arbitrary off-resonance phase term:

$$e^{j\phi(r,t)} = \sum_{k=0}^{N-1} [h_k(r) T_k(t)],$$

where we separate the off-resonance phase term into a spatial function $h_k(r)$ (Chebyshev polynomial coefficients) and a time function $T_k$ (Chebyshev polynomials in time). This is a different approximation than a Chebyshev approximation reported previously for B0 inhomogeneity correction. Based on this separation, the final image $m(r)$ can be reconstructed rapidly using CPR:

$$m(r) = \sum_{k=0}^{N-1} [c_k(r) p_k(r)],$$

where $c_k(r)$ are spatial interpolation coefficients and $p_k(r)$ are base images that can be reconstructed by gridding. For spiral scanning, $c_k(r)$ depends only on the value of B0 inhomogeneity and concomitant gradient fields. Therefore, $c_k(r)$ can be pre-calculated for a range of B0 inhomogeneity and concomitant gradient field values and used later for reconstruction of any data sets acquired using same spiral readout length. The number of base images required is proportional to the range of off-resonance phase accrual. We incorporate linear concomitant gradient correction and center and/or linear B0 inhomogeneity correction into CPR to reduce the off-resonance range.

The concomitant gradient field map can be calculated from the applied gradient. The correction of B0 inhomogeneity, however, requires the knowledge of an accurate B0 map. Semi-automatic correction has been proposed to reduce this problem. Semi-automatic correction requires calculating the value of individual pixels at an arbitrary constant frequency without reconstructing the whole image at the same frequency. Chebyshev approximation is well suited for this purpose and therefore it can be used for combined semi-automatic off-resonance and concomitant field correction.

Figure 11A:
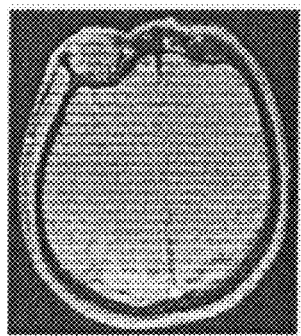
FIGS. 11A-11D show experimental results with Chebyshev approximation.
Figure 11B:
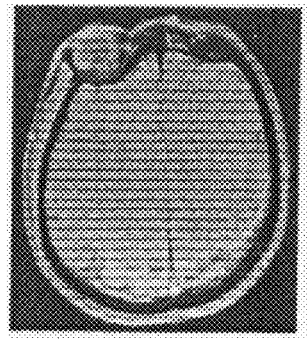
Figure 11C:
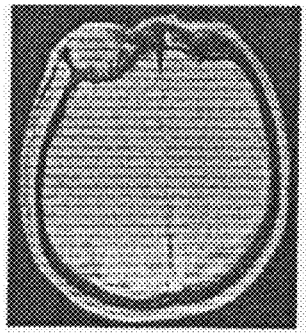
Figure 11D:
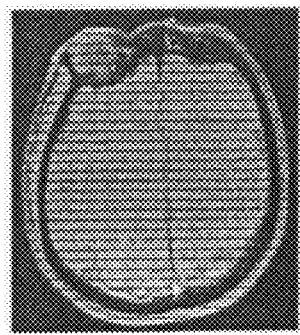

We applied the proposed algorithm to both phantom and in vivo data sets acquired from a 1.5 T Siemens Avanto scanner using spiral sequences. We used the following parameters for the spiral scanning: 14 interleaves with 8192 samples and 2 microseconds ADC dwell time per interleaf, 5 mm slice thickness and 512 by 512 reconstructed image matrix. A low resolution field map was acquired using two single-shot spirals with a 1 ms echo delay. FIGS. 11A-11D show a double oblique spiral scan of a normal volunteer with no correction (FIG. 11A), Maxwell field correction using Chebyshev approximation (FIG. 11B), semi-automatic off-resonance correction (FIG. 11C), and combined correction using Chebyshev approximation (FIG. 11D). Tagging lines are created to make the off-resonance effects more prominent. The imaging slice is 8.4 cm off isocenter along the transverse direction, 2.6 cm off isocenter along the sagittal direction, and 4.8 cm off isocenter along the coronal direction. The imaging plane is tilted 30 degrees from transverse to coronal and then tilted 15 degrees from coronal toward sagittal. The combined correction can achieve more accurate off-resonance correction than either B0 or concomitant field correction alone for spiral scanning.

The present method is computationally efficient for combined off-resonance correction in spiral scanning. The only computational difference compared to that of fast CPR methods applied for B0 inhomogeneity or concomitant gradient field correction alone is the increased number of base images resulting from the increased total off-resonance phase accrual. This added computation can be significantly reduced by incorporating linear concomitant gradient correction and center and/or linear B0 inhomogeneity correction. It can be further reduced by interchanging the sequence of gridding and demodulation.

Chebyshev approximation is an efficient and effective method to approximate an arbitrary phase term. Therefore, it can be a useful tool in the correction of concomitant gradient fields arising from non-spiral gradients. It can be used to correct for other complicated phase terms such as eddy currents, in addition to off-resonance phase. In addition to conjugate phase reconstruction, phase approximation using Chebyshev polynomials can also be combined with other image reconstruction methods such as SPHERE to achieve fast computation.

The off-resonance phase arising from concomitant gradients varies non-linearly in time; however, it can be roughly approximated by an off-resonance phase with a linear time variation. Interestingly, semi-automatic correction using conventional fast CPR corrects somewhat for simultaneous B0 inhomogeneity and concomitant gradients, because the automatic step detects the concomitant gradients. When the concomitant gradient fields become large or the non-linearity becomes significant, semi-automatic correction is insufficient for combined off-resonance correction and the proposed combined correction becomes necessary.

The concomitant gradient fields are proportional to the distance from isocenter. Gradient non-linearity becomes more pronounced when the imaging plane is far from isocenter. We have not observed obvious effects from gradient non-linearity on the Maxwell field correction alone or the combined correction on the data sets we tested.

We discussed the off-resonance effects on spiral parallel imaging using BOSCO. Image blurring due to off-resonance is still a problem in spiral parallel imaging. The existing off-resonance correction methods can be extended to spiral parallel imaging for image de-blurring. Additional computational time for image deblurring in BOSCO reconstruction is similar to that needed for off-resonance correction in non-parallel imaging.

We also demonstrate that off-resonance can interfere with unaliasing in non-Cartesian parallel imaging. For BOSCO k-space-based reconstruction methods, maintaining consistency between the training source and the training target is the preferred method of preventing the degradation of unaliasing in the presence of off-resonance. Inconsistency between the PSFs of the training source and the training target can be corrected using conjugate T2* decay are also observed in our simulation.

For off-resonance correction based on iterative SENSE reconstruction, image deblurring and unaliasing are carried out simultaneously. Compared to this method, off-resonance correction using BOSCO is non-iterative and less computationally demanding and memory intensive.

We focused on our discussion on BOSCO reconstruction. There are a number of other k-space based spiral parallel imaging methods. We expect that the general principles discussed in this chapter are also applicable to these methods We discussed off-resonance effects in spiral parallel reconstruction based on BOSCO. The image blurring due to off-resonance is same in non-parallel and parallel spiral acquisition. The off-resonance correction methods developed for non-parallel non-Cartesian imaging can be combined with BOSCO for simultaneous unaliasing and deblurring in spiral parallel imaging without losing computational efficiency. In addition to causing image blurring, off-resonance can also cause the degradation of unaliasing in BOSCO reconstruction when the off-resonance PSF is inconsistent between the training source and the training target. This problem can be addressed by applying conjugate phase reconstruction or its fast alternatives on the training source and the training target.

Figure 10:
FIG. 10 is a schematic diagram of hardware on which the present invention can be implemented.

FIG. 10 is a schematic diagram of hardware on which the preferred embodiment can be implemented. The hardware 1000 includes a scanner 1002, a processor 1004 for performing the operations disclosed above, and a display or other output 1006.

While a preferred embodiment has been set forth in detail above, those skilled in the art who have reviewed the present disclosure will readily appreciate that other embodiments can be realized within the scope of the invention. Some variations have been set forth above. Also, numerical values are illustrative rather than limiting, as are recitations of specific technologies and sources. Therefore, the present invention should be construed as limited only by the appended claims.

The invention claimed is:

1. A method for imaging an object, the method comprising:
   (a) scanning the object with a scanner having a plurality of coils to obtain a raw time signal from each of the coils;
   (b) calculating an unaliased and deblurred image for each of the coils; and
   (c) combining the unaliased and deblurred images into a final image;
wherein step (b) comprises: (i) demodulating the raw time signal from each of the coils to obtain a demodulated data set corresponding to each of the coils; (ii) convolving each said demodulated data set onto a Cartesian grid to form a gridded data set; (iii) forming unaliased Cartesian k-space data by performing an operation on the gridded data sets formed in step (b)(ii); and (iv) forming unaliased channel images from the unaliased Cartesian k-space data.

2. The method of claim 1, wherein the object is scanned through a spiral scan.

3. The method of claim 1, wherein step (b)(iii) is performed using a convolution.

4. The method of claim 3, wherein step (b)(iii) is performed using a BOSCO convolution.

5. The method of claim 4, wherein step (b)(iv) is performed using a Fourier transform.

6. The method of claim 3, wherein step (b) is performed using multifrequency interpolation.

7. The method of claim 3, wherein step (b) is performed using conjugate phase reconstruction.

8. The method of claim 3, wherein step (b) is performed using a fast approximation to conjugate phase reconstruction.

9. The method of claim 8, wherein the fast approximation to conjugate phase reconstruction is multifrequency reconstruction.

10. The method of claim 8, wherein a field map is used for deblurring, and wherein the field map used for deblurring is derived using a semi-automatic method.

11. The method of claim 2, wherein step (b) comprises:
   (i) performing a reconstruction on the raw time signal from each of the coils to obtain unaliased k-space data on Cartesian grids;
   (ii) generating a set of phase masks on the Cartesian grids using constant demodulation frequencies;
   (iii) multiplying the unaliased k-space data with the phase masks; and
   (iv) forming a set of base images from the unaliased k-space data multiplied with the phase masks.

12. The method of claim 11, wherein step (b)(i) is performed using a BOSCO reconstruction.

13. The method of claim 11, wherein step (b)(iv) is performed using a Fourier transform.

14. The method of claim 11, wherein step (c) comprises combining the base images through multifrequency interpolation.

15. A system for imaging an object, the system comprising:
- a scanner having a plurality of coils to obtain a raw time signal from each of the coils;
- a processor, in communication with the scanner, for calculating an unaliased and deblurred image for each of the coils and combining the unaliased and deblurred images into a final image; and
- an output, in communication with the processor, for outputting the final image; wherein the unaliased and deblurred image for each of the coils is calculated by:
  (i) demodulating the raw time signal from each of the coils to obtain a demodulated data set corresponding to each of the coils;
  (ii) convolving each said demodulated data set onto a Cartesian grid to form a gridded data set;
  (iii) forming unaliased Cartesian k-space data by performing an operation on the gridded data sets formed in step (ii); and
  (iv) forming unaliased channel images from the unaliased Cartesian k-space data.

16. The system of claim 15, wherein the scanner performs a spiral scan.

17. The system of claim 15, wherein the processor performs step (iii) using a convolution.

18. The system of claim 17, wherein the processor perform step (iii) using a BOSCO convolution.

19. The system of claim 18, wherein the processor performs step (iv) using a Fourier transform.

20. The system of claim 17, wherein the processor deblurs the images using multifrequency interpolation.

21. The system of claim 17, wherein the processor deblurs the images using conjugate phase reconstruction.

22. The system of claim 17, wherein the processor deblurs the images using a fast approximation to conjugate phase reconstruction.

23. The system of claim 22, wherein the fast approximation to conjugate phase reconstruction is multifrequency reconstruction.

24. The system of claim 22, wherein a field map is used for deblurring, and wherein the field map used for deblurring is derived using a semi-automatic method.

25. The system of claim 16, wherein the unaliased and deblurred image for each of the coils is calculated by:
  (i) performing a reconstruction on the raw time signal from each of the coils to obtain unaliased k-space data on Cartesian grids;
  (ii) generating a set of phase masks on the Cartesian grids using constant demodulation frequencies;
  (iii) multiplying the unaliased k-space data with the phase masks; and
  (iv) forming a set of base images from the unaliased k-space data multiplied with the phase masks.

26. The system of claim 21, wherein the processor performs step (i) using a BOSCO reconstruction.

27. The system of claim 25, wherein the processor performs step (iv) using a Fourier transform.

28. The system of claim 25, wherein the processor combines the base images through multifrequency interpolation.

\* \* \* \* \*

UNITED STATES PATENT AND TRADEMARK OFFICE
CERTIFICATE OF CORRECTION

PATENT NO. : 8,306,289 B1
APPLICATION NO. : 12/036805
DATED : November 6, 2012
INVENTOR(S) : Meyer et al.

Page 1 of 1

It is certified that error appears in the above-identified patent and that said Letters Patent is hereby corrected as shown below:

In the specification

In column 1, line 12, after "herein.", insert --¶STATEMENT OF GOVERNMENT INTEREST¶ This invention was made with government support under HL079110 awarded by the National Institutes of Health. The government has certain rights in the invention.--, therefor Signed and Sealed this
Third Day of May, 2016

Michelle K. Lee
*Director of the United States Patent and Trademark Office*